United States Patent [19]
Roland

[11] Patent Number: 5,397,683
[45] Date of Patent: Mar. 14, 1995

[54] PHOTOCHEMICAL METHOD OF MAKING DECORATIVE DESIGNS

[76] Inventor: Gerald Roland, 3725 N. Fiebrantz Dr., Brookfield, Wis. 53005

[21] Appl. No.: 36,315

[22] Filed: Mar. 24, 1993

[51] Int. Cl.$^6$ .......................... G03C 5/00; G03F 7/32; G03F 7/38; G03F 7/40
[52] U.S. Cl. .................................. 430/294; 430/292; 430/293; 430/320; 430/322; 430/324; 430/325; 430/327; 430/328; 430/329; 430/330; 430/358; 430/394; 430/952
[58] Field of Search ............... 430/293, 294, 295, 320, 430/322, 324, 328, 329, 22, 9, 13, 14, 15, 18, 306, 358, 952, 273, 327, 329, 325, 330, 394

[56] References Cited

U.S. PATENT DOCUMENTS

| | | | |
|---|---|---|---|
| 3,258,337 | 6/1966 | Cousins | 430/293 |
| 4,258,125 | 3/1981 | Edhlund | 430/293 |
| 4,581,320 | 4/1986 | Kreiter | 430/320 |
| 4,596,758 | 6/1986 | Evans et al. | 430/293 |
| 4,640,878 | 2/1987 | Evans et al. | 430/15 |
| 4,710,447 | 12/1987 | Kreiter | 430/293 |

FOREIGN PATENT DOCUMENTS 62-54253 3/1987 Japan .................................. 430/327

Primary Examiner—Janis L. Dote
Attorney, Agent, or Firm—Quarles & Brady

[57] ABSTRACT

A photochemical method of making a tactile design comprises the steps of exposing to light a selected portion of photo-sensitive layer-supported by a substrate; applying a decorative coating to the photo-sensitive layer; applying a photo-sensitive emulsion over the decorative coating; exposing to light the same selected portion of the photo-sensitive emulsion; and removing the photo-sensitive emulsion, the decorative coating, and the photo-sensitive layer from the non-selected portions. The tactile design comprises a layer of photo-sensitive material fixedly attached to a selected portion of a substrate wherein the layer has been exposed to light and the layer projects away from the surface of the substrate a sufficient distance to be sensitive to the touch. At least one decorative coating is fixedly attached to the photo-sensitive layer.

13 Claims, 2 Drawing Sheets

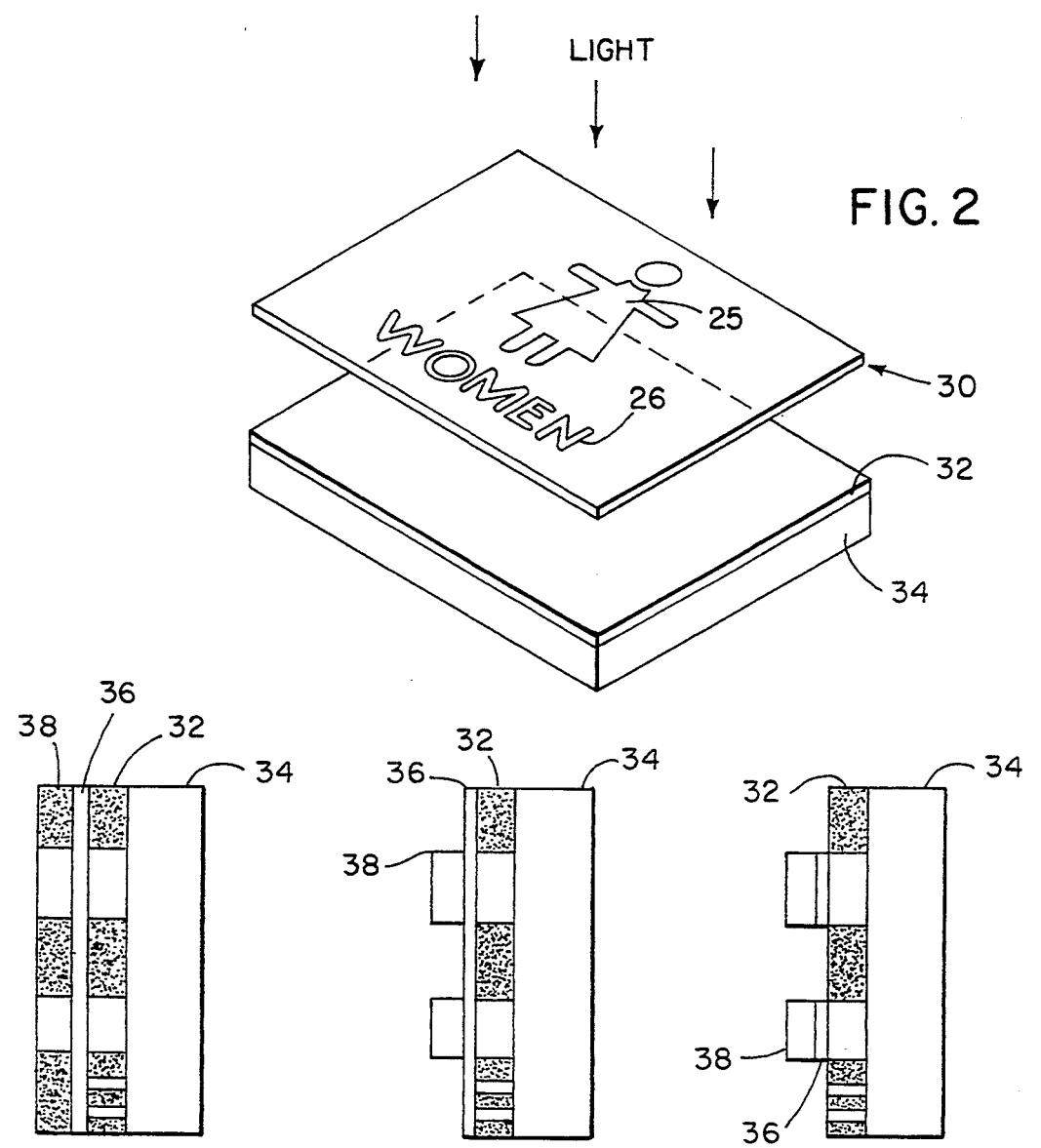
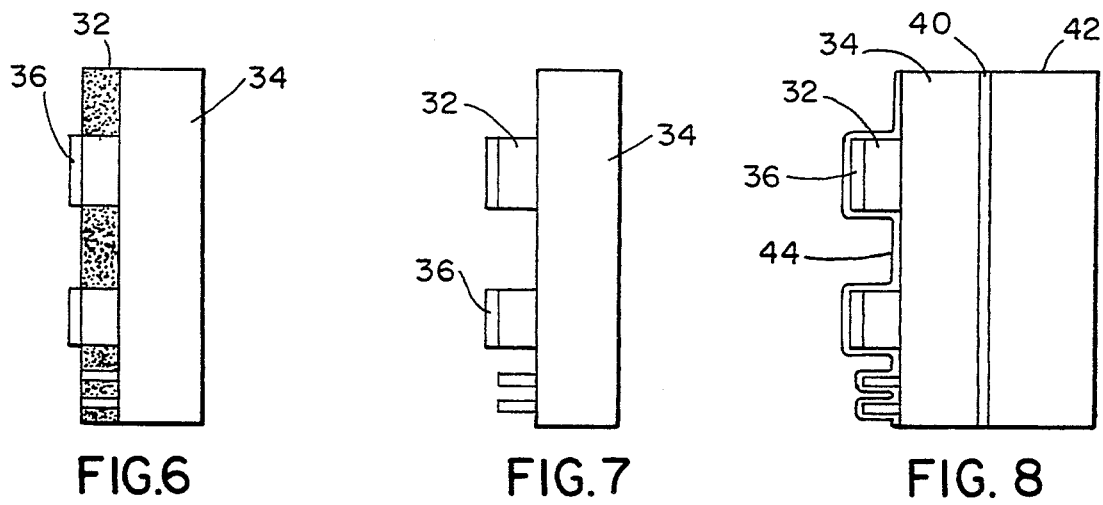

PHOTOCHEMICAL METHOD OF MAKING DECORATIVE DESIGNS

BACKGROUND

The various embodiments of the present invention relate to a photochemical method of making decorative designs, including tactile designs. The tactile design of the present invention is capable of being perceived by the human touch.

The Federal Americans With Disabilities Act (ADA) mandates, inter alia, that public signs incorporate a raised or tactile design capable of being perceived by the touch of visually impaired people.

Conventional processes for making tactile designs typically require a great deal of time and expensive equipment, are limited in color spectrum, can not place one color touching another, are limited in ability to reproduce fine detail, can not easily do multiple colors on one sign (if at all), and are extremely limited in creative latitude. Existing processes are so complex and sensitive to failure that they are impractical and prohibitive for use by the small sign shop. Some examples of conventional processes which can be used to produce signs having a raised or tactile design are engraving (routing), hot stamping, and embossing.

Hot stamping requires expensive and bulky equipment capable of exerting several tons of pressure on the substrate to generate the desired design. Generally, this process is only suitable for operations which can exploit high production rates. Furthermore, there is a high failure rate in producing commercially acceptable product. It is difficult and extremely costly to do more than one color with hot stamping methods. The color spectrum is limited and one color can never touch another color.

Embossing requires expensive male and female dyes which are combined and then applied to the substrate under several tons of pressure. Similarly, expensive and bulky machinery is required so that, in general, this process is restricted to high volume operations. The embossing method also carries a high failure rate in producing commercially acceptable product. Further, adding secondary colors is difficult and expensive and any added colors are limited and can never touch one another.

Engraving or routing requires the removal of substrate material outside of the desired image area. The equipment is relatively expensive and the process offers limited color treatment to the image area. Engraving or routing an average sign requires an inordinate amount of machine time (wear and tear). The process also produces sharp-edged raised designs which are uncomfortable to the reader and, therefore, are undesirable.

Another conventional process is silk screening; it may be used to top-coat a tactile design feature. This process requires expensive screens and copious amounts of ink. Excess ink is needed to be certain that it penetrates the screen mesh. There is a large failure rate in achieving a commercially acceptable product. Adding second, third, etc. colors is difficult and expensive. One color can not touch another color. Additionally, the silk screen process involves extensive equipment clean-up using large quantities of chemicals which may require containment and disposal.

Another conventional process for creating a raised design is the chemical etching of metal plates such as copper, brass, zinc, and magnesium. This process requires the use of costly equipment and large quantities of extremely hazardous chemicals. The chemicals used typically mandate containment and disposal procedures.

It is apparent that presently available processes for the application of a tactile design to a substrate surface requires expensive and bulky machinery, are limited in creative concepts and applications, and produce excessive quantities of unusable/unsalable product. The equipment for these conventional processes must be connected to sources of heat and pressure. Accordingly, the process machinery and ancillary equipment require a large physical plant and capital investment which thereby dictate a high output to achieve an adequate economic return. Generally, small custom design jobs are rendered uneconomical.

For the foregoing reasons, there is a need for an inexpensive and less time-consuming process for producing tactile designs on substrate surfaces. In particular, an economical method is needed for satisfying custom design jobs.

SUMMARY

The present invention is directed to a photochemical method for making a tactile design on a substrate surface and to a substrate bearing the tactile design made by the process. The present invention satisfies the need for an inexpensive and efficient way of making a tactile design on the surface of a substrate.

The present invention possesses many advantages including a requirement of minimal labor and inexpensive equipment, the economical use of inks and photo emulsion, and faster processing. Another advantage of the present invention is the ability to do custom designs, custom colors, and small or single orders economically. Another particular advantage of the present invention is the ability to achieve dead-register color abutments.

The present invention also eliminates messy, time consuming cleanup and space consuming storage as it does not require the use of expensive and space-consuming screen printing, roller coating, or hot stamping equipment. The present invention produces designs of high quality with fine detail, sharp images, and an unlimited color palette when compared to the aforementioned conventional processes.

It is a specific object of this invention to provide a photochemical method of making a tactile design which meets the ADA compliance requirements in a cost efficient manner. Additionally, only minor modifications to the procedure allow the production of conventional top surface or second surface (subsurface) signs with all the aforementioned advantages.

One broad embodiment of the present invention is a tactile design comprising a substrate capable of fixedly accepting a photosensitive material wherein a layer of the photosensitive material is fixedly attached to a selected portion of at least one surface of the substrate. Further, the photosensitive layer has been exposed to light radiation and the layer projects away from the surface of the substrate a sufficient distance to be sensitive to the touch. One or more decorative coatings may be fixedly attached to the photosensitive layer.

In a broad embodiment, these objects, features and others are provided by an improved photochemical imaging method. Utilizing the presently disclosed system, a desired image is created on a suitable substrate which fixedly supports at least one photosensitive layer thereon. A selected portion of the photosensitive layer is then exposed to light. UV radiation may be used as the light source. Selective exposure may be accomplished by using a negative film comprising the desired image.

A decorative coating is then applied to the photosensitive layer of the substrate followed by an application of photosensitive emulsion to the decorative coating. The decorative coating may be printing ink. The photosensitive emulsion is next exposed to light over the same selected portion. Once again, UV radiation may be used as the light source and the negative bearing the desired image may be used to selectively expose the photosensitive emulsion. A drying step may be incorporated after applying the decorative coating, after applying the photosensitive emulsion, and after the removing the nonselected portions.

The decorative coating, the photosensitive layer and the photosensitive emulsion are finally removed from the unexposed portions of the substrate. The removal can be accomplished by subjecting the substrate to a controlled warm water spray which leaves a colored (decorated) and raised design on the exposed portions of the substrate. These raised image areas can be produced by the present invention so that they meet the tactile design requirements mandated by the Americans With Disabilities Act (ADA).

BRIEF DESCRIPTION OF THE DRAWINGS

These and other features, aspects, and advantages of the present invention will become better understood with regard to the following description, appended claims, and accompanying drawings where:

FIG. 2 depicts a perspective view of step 1 in FIG. 1;

FIG. 3 represents a side view of the coated substrate after completing step 7 in FIG. 1;

FIG. 4 represents a side view of the coated substrate after completing step 8 in FIG. 1;

FIG. 5 represents a side view of the coated substrate after completing step 10 in FIG. 1;

FIG. 6 represents a side view of the coated substrate after completing step 12 in FIG. 1;

FIG. 7 represents a side view of the coated substrate after completing step 13 in FIG. 1;

FIG. 8 represents a side view of the coated substrate after completing step 20 in FIG. 1.

DESCRIPTION OF THE PREFERRED EMBODIMENTS

Figure 1:
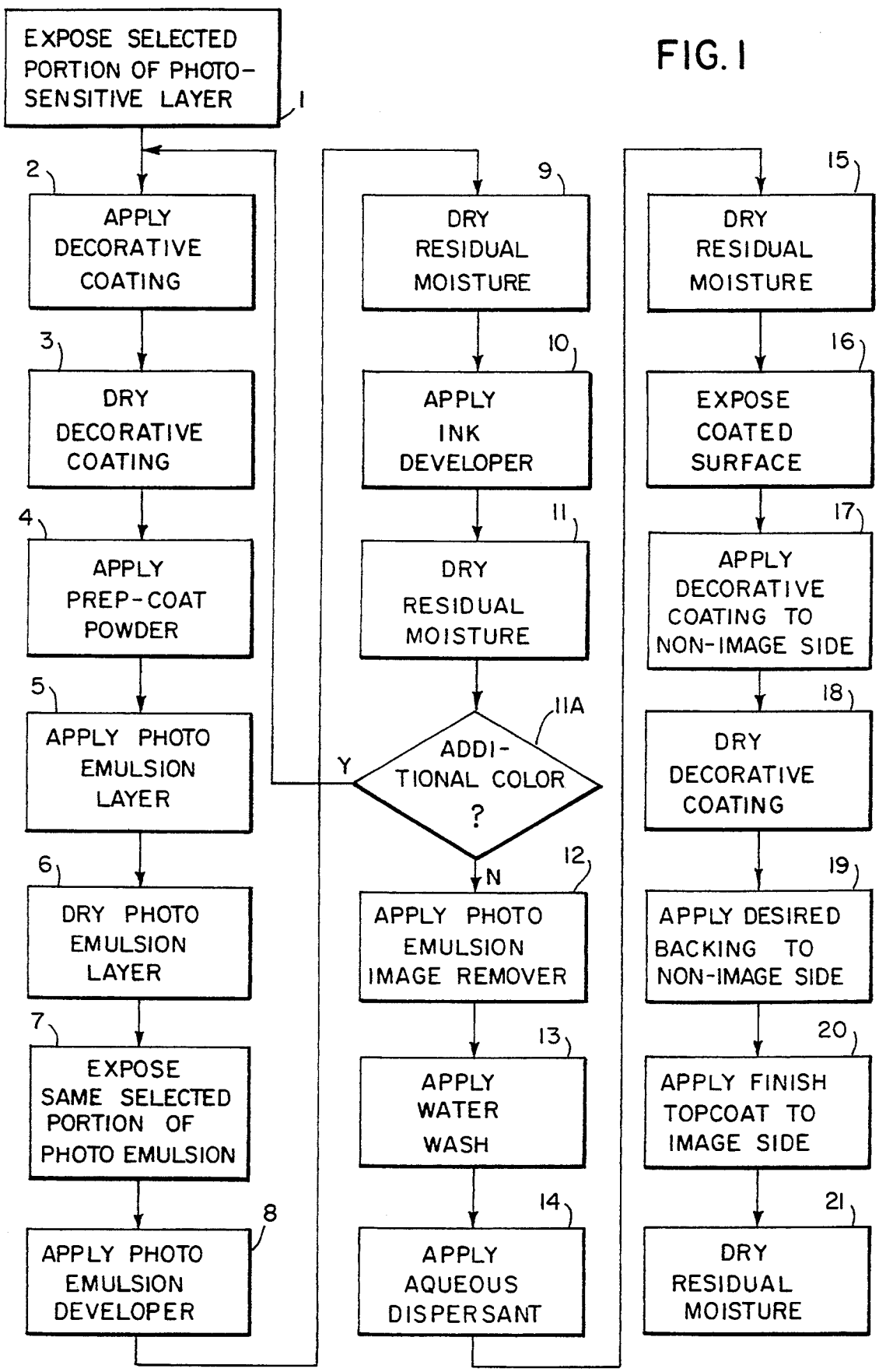
FIG. 1 represents a flow diagram of a preferred embodiment of the present invention.

Referring now to FIG. 1, in step 1, a selected portion of a photosensitive layer fixedly attached to a substrate is exposed to light. The substrate may comprise a variety of suitable materials which are capable of accepting a photosensitive layer. Preferably, the substrate comprises a polyester film. The photosensitive layer is preferably a polyamide-based photosensitive nylon. A preferred substrate having a photosensitive layer attached thereto is available commercially from Toyobo Co., Ltd. of Osaka, Japan and is known as "PRINTIGHT".

In a preferred aspect of the invention, the exposure of the selected portion of the photosensitive layer is accomplished by passing the light through a negative film bearing the desired design. It is desirable to firmly secure the negative to the photosensitive layer by using, for example, a pin register system. The selected portion of the photosensitive layer of the substrate is preferably exposed to UV light for a time of about five minutes. Step 1 of FIG. 1 is depicted in perspective in FIG. 2 where 30 is the negative film, 32 is the photosensitive layer, and 34 is the substrate. The desired design on the negative film 30 may include a stylized FIG. 25 or lettering 26.

Referring now to step 2 in FIG. 1, the image side of the substrate is then coated with a decorative material. The decorative coating of the present invention is preferably a printing ink which may contain lead or chromate pigments depending on the desired color The decorative coating should be applied in a uniform manner preferably by using a coating rod such as commonly used in the printing industry. Thereafter, as step 3 shows, the decorative coating is thoroughly dried. A heating apparatus such as a hand-held dryer can be used for this purpose.

A prep-coat powder is next applied over the decorative coating as shown in step 4 of FIG. 1. Preferably, the powder is rubbed onto the decorative coating with a cotton pad by using the flat of the hand to prevent scratching the decorative coating. The prep-coat powder is preferably an industrial talc of the non-asbestos form. Most preferably the prep-coat powder is hydrous magnesium silicate mineral.

In step 5 of FIG. 1 a layer of photosensitive emulsion is applied over the prep-coat powder treated decorative coating. Preferably the photosensitive emulsion is water based and contains a sensitizer. The sensitizer preferably contains benzenediazonium, 4-(phenylamino)sulphate polymer with formaldehyde. The water based photosensitive emulsion preferably comprises an acrylic ester dimethoxphenyl acetophenone, phthalic acid, dibutyl ester, 1-ethenyl-2-pyrrolidine, and formaldehyde.

The photosensitive emulsion, as in the application of the decorative coating, preferably is applied by using a coating rod. The rod is pulled into the photo emulsion and down the substrate surface at medium speed with enough pressure to hold the rod securely flat against the coated surface of the substrate. The photosensitive emulsion is then thoroughly dried as shown in step 6 of FIG. 1. A heating apparatus such as a hand-held dryer may be used as in step 3 above. Preferably the surface of the dry photosensitive emulsion is then rubbed with a powdered pad before the next step.

In step 7, FIG. 1, the same selected portion of the coated substrate surface is exposed to light. As in step 1, the light is preferably UV light and the exposure time is about five minutes. The negative film bearing the desired design that was used in step 1 is preferably used here in step 7. Again, as in step 1, a pin register system is useful for securing the negative to the coated surface of the substrate.

Turning now to FIG. 3, a side view of the coated substrate is shown after having completed processing through step 7 in FIG. 1. The stippled portions are the unexposed areas of the various layers. As in FIG. 2, layer 34 is the substrate while 32 is the exposed photosensitive layer. Layer 36 is the decorative coating applied in step 2. The exposed photosensitive emulsion layer is 38.

In step 8, FIG. 1, a photo emulsion developer is applied to the coated surface of the substrate in order to remove unexposed photosensitive emulsion. The developer is preferably applied with a foam pad. The pad preferably is wiped across the coated surface until the unexposed photosensitive emulsion is seen breaking up and dissolving. A preferred practice is to then gently wipe a cotton pad across the coated surface to remove any dissolved photosensitive emulsion residue.

The photo emulsion developer preferably contains an image hardener to help harden the exposed portion of the photosensitive emulsion. The photo emulsion developer preferably contains an alkali material such as an ammonia-based solution.

Turning now to FIG. 4, a side view of the coated substrate is depicted after completing processing through step 8, FIG. 1. Layer 38 is the remaining photo emulsion while layers 32, 34, and 36 are the same as those layers depicted in FIG. 3.

In step 9, FIG. 1, the coatings are thoroughly dried. A heating device such as a hand-held dryer may be used. In step 10, FIG. 1, ink developer is applied to the coated surface of the substrate to remove the portion of the decorative coating which is not protected by the exposed (and preferably hardened) photo emulsion (see FIGS. 4 and 5). The ink developer is preferably applied by using a foam pad as discussed step 8. Sufficient ink developer is applied until the background ink is seen breaking up and dissolving. The ink developer is preferably a dipropylmethane/1-methoxy-2-propanol acetate based developer.

Turning now to FIG. 5, a side view of the coated substrate is shown where processing has been completed through step 10 of FIG. 1. Layer 38 is the remaining exposed photo emulsion and layer 36 is the remaining decorative coating (which has been protected by the overlying exposed photo emulsion layer 38). Layers 32 and 34 are the same layers as depicted in FIG. 3.

In step 11, FIG. 1, the coated surface of the substrate is again thoroughly dried. A heating device such as a hand-held dryer may be used.

In another embodiment of the invention, multiple decorative layers may be applied to the coated substrate. If multiple decorative layers are desired, after completing step 11, the coated substrate is then re-processed through each of steps 2 to 11 as set forth above. As many decorative coatings or colors may be applied to the substrate by re-processing in this manner. This embodiment is represented in FIG. 1 by the decision box 11A.

In step 12, FIG. 1, photo emulsion image remover is applied to the coated surface of the substrate to remove the remaining hardened photo emulsion layer 38 (see FIGS. 5 and 6). The purpose of step 12 is to remove the remaining hardened photo emulsion down to the decorative layer so that the appearance of the decorative layer(s) is not affected by the overlying hardened photo emulsion layer. Preferably, a liberal amount of photo emulsion image remover should be applied to the image portion and then gently wiped with a soft cloth or paper towel. The photo emulsion image remover is preferably sodium metaperiodate.

Turning now to FIG. 6, a side view of the coated substrate is depicted where layer 36 is the newly exposed remaining decorative coating after completing the processing of step 12. Layers 32 and 34 are the same as those represented in FIG. 3.

In step 13, FIG. 1, the coated surface of the substrate is washed with water to remove the unexposed photosensitive layer 32 (see FIGS. 6 and 7). Below ambient water temperatures may be used. However, this will lengthen the washout time and weaken the image. Preferably the temperature of the water wash is about 85° to about 110° F. and the wash is applied to the substrate as a spray. If the water wash is applied as a spray, thermodynamic considerations dictate a water supply temperature of about 140° F. to a spray nozzle. The water wash is continued until the background is completely clear with no milky residue hanging in the image area. More particularly, it is important not to over process the coated substrate surface with the water wash.

Turning now to FIG. 7, a side view of the coated substrate is shown where layer 32 is the remaining photosensitive layer after completing the processing step 13 in FIG. 1. Layer 36 is identical to layer 36 in FIG. 6. Layer 34 again represents the substrate.

In step 14, FIG. 1, an aqueous dispersant solution is applied to the coated substrate. Preferably, the coated substrate is submerged completely in the aqueous dispersant solution. Submersion is preferably done for a minimum of 15 to 30 seconds. The aqueous dispersant preferably contains a wetting agent capable of dispersing minerals from the water wash in step 13.

After immersion in the aqueous dispersant, the substrate is then removed from the dispersant. As shown in step 15, FIG. 1, the substrate is next thoroughly dried. A heating device such as a hand-held dryer may be used.

In step 16, FIG. 1, the coated substrate is exposed to light to complete the hardening process. The light is preferably UV radiation. The exposure time is preferably five minutes.

In step 17, FIG. 1, a decorative coating, if desired, is applied to the non-image side of the substrate. Preferably, this can be achieved by adjusting the decorative coating of step 2, FIG. 1, to a spraying consistency. Several coats may be required, with drying between coats, until the color is of the desired density.

Alternatively, if it is desired to create a decorative image or images on the reverse side of the substrate (in the background behind the raised/tactile image), then this decoration can be created before beginning step 1 with only minor modifications to the procedure and thereby eliminating steps 17 and 18.

In step 18, FIG. 1, the coated substrate is allowed to completely dry. Preferably, several hours to overnight should be allowed for the drying. In step 19, FIG. 1, after drying is complete, adhesive is applied to the non-image side of the substrate. A desired support backing is then mounted onto the non-image side. The backing may be trimmed and finished.

In step 20, FIG. 1, a topcoat of clear topcoat is applied, if desired, to the coated surface of the substrate. The topcoat is typically a clear matte spray topcoat comprising alkyd-cellulose nitrate lacquer. Several coats may be applied, with drying between the coats, to achieve the desired eggshell finish on the image side of the substrate. In step 21, FIG. 1, the coated substrate is dried thoroughly.

Turning now to FIG. 8, a side view of the coated substrate is depicted after completing processing through step 21, FIG. 1. Layers 32, 34, and 36 are the same as the layers discussed in FIG. 7 above. Layer 40 is the decorative coating applied to the non-image side of the substrate in step 17. Layer 42 is the support backing mounted to the non-image side of the substrate in step 19. Layer 44 is the topcoat finish applied to the image side of the substrate in step 20. The raised or tactile design is typically at least 1/32" thick.

The products produced by the various aspects of the present invention are used in a variety of ways. Most importantly, the raised or tactile designs of the invention satisfy the requirements of the American With Disabilities Act (ADA). Further, the tactile designs of one aspect of the present invention can be used in many architectural environments. Because of the choice of decorative coatings and the ease of applying these coatings, signs may be produced that are compatible and attractive in any type of environment. The designs of one aspect of the present invention can be used for interior or exterior applications because the printing inks or decorative layers are of permanent grade.

The various aspects of the present invention provide a way of making tactile designs economically. There is no requirement for time-consuming and expensive screens, or the need for heavy and expensive equipment. The process is economical enough so that even single designs can be done in a cost-efficient manner. For the foregoing reasons, the present invention has many advantages over the conventional methods of engraving (routing), hot stamping, and embossing.

Other Embodiments

Although the present invention has been described in considerable detail with reference to certain preferred versions thereof, other versions are possible. For example, the present inventive process can produce combined subsurface and tactile designs on one substrate. Another variation includes the production of non-raised decorative images on the top surface or second surface (subsurface) of a variety of substrates such as plastics, wood, or metals.

Referring again to FIG. 1, a combined subsurface and tactile design can be produced on a single substrate by making minor modifications to the tactile design process. Specifically, in place of steps 17 and 18, steps analogous to 2 through 11A are performed before steps 1 through 16 and 19 through 21 are completed.

Referring to FIG. 1 again, a non-raised decorative image on the top surface or second surface (subsurface) of a substrate can be produced by making minor modifications to the tactile design process. Preferably, a plain matte plex blank (having no photosensitive layer) is subjected to steps 2 through 12 and then finished by applying a background color and a desired backing material.

Accordingly, the spirit and scope of the appended claims should not be limited to the description of the preferred versions contained herein.

What is claimed is:

1. A photochemical method of making a tactile design comprising the steps of:
    (a) providing at least one photosensitive layer fixedly attached to a substrate;
    (b) exposing a selected portion of the at least one photo-sensitive layer to light;
    (c) applying, after step (b), a decorative coating to the at least one photo-sensitive layer;
    (d) drying the decorative coating;
    (e) applying a prep-coat powder over the decorative coating;
    (f) applying a photo-sensitive emulsion over the prep-coat powder;
    (g) drying the photo-sensitive emulsion;
    (h) then exposing the photo-sensitive emulsion to light over the same selected portion;
    (i) removing the photo-sensitive emulsion from areas unexposed in step (h);
    (j) then drying residual moisture from step (i);
    (k) then removing the decorative coating from areas left unprotected by the removing of the photo-sensitive emulsion in step (i);
    (l) then drying residual moisture from step (k);
    (m) then removing the photo-sensitive emulsion from areas exposed in step (h);
    (n) then removing the photo-sensitive layer from areas unexposed in step (b) and thereby forming the tactile design;
    (o) then applying a dispersant to the tactile design;
    (p) then drying residual moisture from steps (n) and (o);
    (q) then exposing the tactile design to light until all areas of the tactile design are hardened.

2. The method of claim 1 wherein the light in steps (b), (h), and (q) is UV radiation.

3. The method of claim 2 wherein successive decorative coatings are applied by repeating each of steps (c) through (l) before proceeding to steps (m) through (q).

4. The method of claim 3 wherein the decorative coating is printing ink.

5. The method of claim 4 wherein the substrate is a polyester film and the photo-sensitive layer is a polyamide-based photosensitive nylon.

6. The method of claim 5 wherein a film negative of the tactile design is used to expose the selected portion in each of steps (b) and (h).

7. The method of claim 6 comprising applying after step (q) a decorative coating to a surface of the substrate not bearing the tactile design.

8. The method of claim 7 comprising attaching a support to the surface of the substrate not bearing the tactile design.

9. The method of claim 8 comprising applying a clear matte topcoat to the surface of the tactile design.

10. The method of claim 5 wherein a spray water wash is used for the removing step (n).

11. The method of claim 4 wherein an ink developer is used for the removing step (k).

12. The method of claim 1 wherein a photo-emulsion developer is used for the removing step (i).

13. The method of claim 1 wherein the decorative coating is printing ink.

* * * * *